United States Patent [19]

Nagarekawa et al.

[11] Patent Number: 4,657,648

[45] Date of Patent: Apr. 14, 1987

[54] METHOD OF MANUFACTURING A MASK BLANK INCLUDING A MODIFIED CHROMIUM COMPOUND

[76] Inventors: Osamu Nagarekawa; Shigekazu Matsui, both of Yamanashi, Japan

[21] Appl. No.: 656,353

[22] Filed: Oct. 1, 1984

Related U.S. Application Data

[60] Division of Ser. No. 550,006, Dec. 29, 1983, Pat. No. 4,530,891, which is a continuation of Ser. No. 357,878, Mar. 15, 1982, abandoned.

[30] Foreign Application Priority Data

Mar. 17, 1981 [JP] Japan .................................. 56-37202

[51] Int. Cl.$^4$ ................................................ C23C 14/36
[52] U.S. Cl. .............................. 204/192.26; 204/192.15
[58] Field of Search ............................ 204/192 P, 192 C

[56] References Cited

U.S. PATENT DOCUMENTS 4,096,026  6/1978  Takeuchi ............................. 156/656
4,363,846  12/1982  Kaneki ................................. 428/203

FOREIGN PATENT DOCUMENTS 143931  9/1980  German Democratic Rep. .................................. 204/192 P
54-153790  12/1979  Japan ................................. 204/192 P Primary Examiner—John F. Niebling
Assistant Examiner—William T. Leader
Attorney, Agent, or Firm—Roberts, Spiecens & Cohen

[57] ABSTRACT

In a photo-mask blank, a transparent substrate is covered with a shading layer including chromium and chromium carbide. Covered on the shading layer, is an antireflection layer which includes chromium and chromium nitride. The shading and the antireflection layers are deposited in the same hollow space by sputtering. An etch rate of the shading layer is adjustable to that of the antireflection layer to make both etch rates equal and, thereby, to reduce undercuts appearing at the shading layer.

7 Claims, 4 Drawing Figures

METHOD OF MANUFACTURING A MASK BLANK INCLUDING A MODIFIED CHROMIUM COMPOUND

BACKGROUND OF THE INVENTION

This is a divisional on application Ser. No. 550,006, filed 12/29/83, now U.S. Pat. No. 4,530,891 which in turn is a continuation of Ser. No. 357,878, filed 3/15/82, now abandoned.

This invention relates to a method of manufacturing a photo-mask blank for use in lithography.

In general, a photo-mask blank is selectively etched or processed into a mask indispensable to the lithography technique of semiconductor integration. As a photo-mask blank, well-known is a chromium mask blank comprising a transparent glass substrate and a shading layer of chromium for shading incident light thereon.

In order to reduce the intensity of light reflected from the shading layer, the chromium mask blank very often comprises an antireflection layer of chromium oxide coated on the shading layer. The latter blank has a low reflectance, namely, a low reflection index and will, therefore, be referred to as a low reflection blank hereinafter.

In any event, the photo-mask blank is covered with a photo-resist layer on fabrication of the mask to delineate patterns on the photo-mask blank.

A conventional low reflection blank is manufactured by coating, in turn, the shading layer of chromium and the antireflection layer of chromium oxide on the transparent substrate by the use of sputtering and/or vacuum evaporation. As will later be described with reference to the figures of the accompanying drawing, the conventional low reflection blank exhibits a relatively high reflection index except a predetermined wavelength region when it is uncovered and covered with the photoresist layer. Therefore, the conventional low reflection blank inevitably imposes restrictions on the usable wavelength region.

Furthermore, the conventional low reflection blank is disadvantageous in that the shading layer of chromium is etched by an etchant faster than the antireflection layer of chromium oxide covered on the shading layer on fabrication of the mask. As a result, undercuts take place at the shading layer underlying an edge of the antireflection layer. This makes it difficult to delineate fine patterns on the glass substrate.

SUMMARY OF THE INVENTION

It is an object of this invention to provide a method of manufacture of a photo-mask blank for use in a lithography technique, which is capable of reducing undercuts on fabrication of a mask.

It is another object of this invention to provide a method of manufacture of a photo-mask blank whose reflection index is invariable over a broad wavelength.

It is yet another object of this invention to provide a method of manufacture of a photo-mask blank, which is capable of delineating fine patterns.

It is still another object of this invention to provide a method of manufacturing a photo-mask blank covered with a shading layer and an antireflection layer on the shading layer, wherein the shading layer and the antireflection layer are continuously formed in an identical hollow space.

It is another object of this invention to provide a method of the type described, which is capable of adjusting an etch rate of a shading layer to that of an antireflection layer.

A photo-mask blank to which this invention is applicable is for use in lithography and comprises an optically transparent substrate having a principal surface and a shading layer on the principal surface for shading light in a predetermined wavelength region. According to this invention, the shading layer includes chromium and chromium carbide to provide coexistence of the chromium and the chromium carbide. The photo-mask blank further comprises an antireflection layer including chromium oxide and chromium nitride. The etch rate of the shading layer is not higher than that of the antireflection layer and undercuts are suppressed at the shading layer.

DESCRIPTION OF THE PREFERRED EMBODIMENTS

Figure 1:
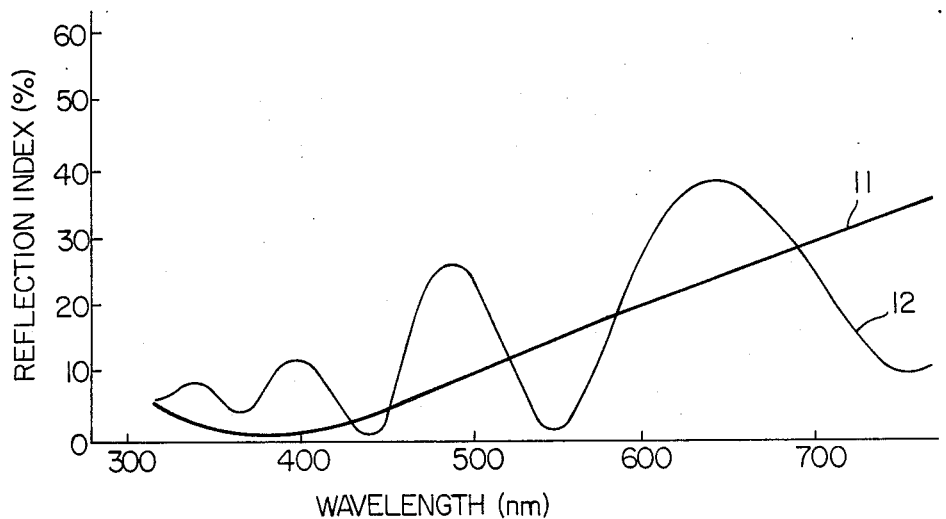
FIG. 1 shows a graph of reflection index versus wavelength characteristics of a conventional photo-mask blank.

Referring to FIG. 1, wherein the abscissa and the ordinate represent wavelength (nanometers) and reflection index (percent), respectively, description will be made of a conventional low reflection blank for a better understanding of this invention. The conventional low reflection blank comprises a thoroughly polished glass substrate, a metal layer of chromium formed on the glass substrate to a thickness of about 800 angstroms, and a chromium oxide layer formed on the metal layer to a thickness of about 250 angstroms. The metal and the chromium oxide layers serve as a shading and an antireflection layer, respectively. The metal layer is formed at a deposit rate of about 35 angstroms per second in an argon atmosphere of $5 \times 10^{-3}$ Torr by the use of a d.c. sputter device of a planar magnetron type. The d.c. sputter device was adjusted so that the metal layer to be formed became equal in optical density to 3.0. On the other hand, the chromium oxide layer was coated onto the metal layer at the deposit rate of 1 angstrom per second in an oxygen atmosphere of about $1 \times 10^{-4}$ Torr by the use of an evaporation device.

In FIG. 1, curve 11 shows a reflection index versus wavelength characteristic of the conventional photo-mask blank without a photoresist layer. The reflection index was measured by a known spectrometer above the antireflection layer, namely, chromium oxide layer. As readily understood from curve 11, the conventional mask blank per se exhibits a low reflection index in a wavelength region below 500 nanometers. A curve 12 shows a similar characteristic of the conventional blank covered with a photoresist layer. The photoresist layer consists of AZ-1350 manufactured and sold by Shipley Far East Ltd., Tokyo, Japan. As shown by the curve 12, the reflection index is widely varied and locally exceeds twenty percent even in the wavelength region below 500 nanometers when the photoresist layer is coated on the conventional blank. Inasmuch as the photoresist layer should be exposed to light having a predetermined wavelength less than 500 nanometers so as to delineate mask patterns on fabrication of a mask, resolution of an image is inevitably deteriorated, if the reflection index exceeds twenty percent with the photoresist layer coated on the blank, as shown by the curve 12 in FIG. 1.

According to the inventors' experimental study, the metal layer of chromium was excessively etched by an etchant as compared with the chromium oxide layer and, as a result, undercuts inevitably occur at the metal layer underlying an edge of the chromium oxide layer. In practice, use was made, as the etchant, of a solution of 1000 milliliters formed by adding distilled water to 165 grams of ceric ammonium nitrate and 42 milliliters of perchloric acid (70%). Etching was carried out for twenty seconds, with the solution kept at 19°-20° C. It is mentioned here that the amount of undercuts can quantitatively be defined by a side etch rate representative of a reduction rate of a pattern width for ten seconds. As regards the conventional low reflection blank, the side etch rate thereof was about 0.20 micron per ten seconds.

Figure 2:
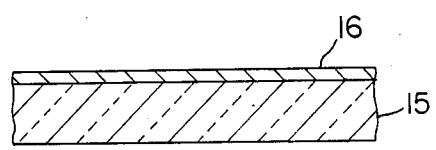
FIG. 2 shows a fragmentary cross section of a photo-mask blank according to this invention.

Referring to FIG. 2, a chromium mask blank according to an embodiment of this invention comprises a thoroughly polished glass substrate 15 transparent to light in a predetermined wavelength region and having a principal surface. The predetermined wavelength region may at least include a wavelength region between 350 and 600 nanometers and may, of course, include a region from the ultraviolet region to the infrared region.

A shading layer 16 is on the principal surface and includes chromium and chromium carbide dispersed in the chromium. The shading layer 16 serves to shade the light in the predetermined region. Practically, the shading layer 16 of chromium and chromium carbide shades the light from the ultraviolet region to the infrared region. The chromium and the chromium carbide may coexist in the form of an interstitial carbide of chromium in the shading layer 16. The chromium carbide may be unequally dispersed in the shading layer 16. Thus, the chromium mask blank illustrated in FIG. 2 includes a modified chromium compound in the form of chromium carbide in the shading layer 16.

The shading layer 16 was deposited by the use of a d.c. sputtering device of a planar magnetron type known in the art. More particularly, the substrate 15 was located in a hollow space defined by a chamber or belljar (not shown) of the sputtering device, along with a target of chromium. The hollow space was filled with a mixed gas including argon and methane ($CH_4$) after evacuation by an exhausting system in the usual manner. At this time, total pressure of the hollow space was kept at about $1 \times 10^{-3}$ Torr.

Under these circumstances, reactive sputter was carried out by sputtering particles of the target onto the substrate 15 to deposit the shading layer 16 including the chromium and the chromium carbide. The chromium carbide in the shading layer 16 results from reaction of the sputtered particles of chromium with carbon included in the methane. During sputter, the sputtering device was adjusted so that the optical density of the deposited layer became equal to 3.0. It has been confirmed that the deposited shading layer 16 shades light from the substrate 15.

Various photo-mask blanks were experimentally manufactured to seek relationships between the etch rate and a mixed ratio of the argon and the methane. The relationships are listed in Table 1 below. In Table 1, the shading layers according to this invention are labelled A, B, C, and D while the conventional shading layer is shown at E.

TABLE 1

| | Mixed Ratio (by volume) Ar:$CH_4$ | Thickness (Å) | Etching Time (sec) | Etch Rate (Å/sec) |
|---|---|---|---|---|
| A | 95 5 | 560 | 36 | 16 |
| B | 90 10 | 570 | 45 | 13 |
| C | 85 15 | 575 | 56 | 10 |
| D | 80 20 | 580 | 66 | 9 |
| E | 100 0 | 550 | 24 | 23 |

As readily understood from Table 1, the shading layer (shown at E) including no chromium carbide is faster in etch rate than the shading layers (shown at A-D) including chromium carbide. The etch rate is gradually reduced with an increase of the methane in the mixed gas. Accordingly, it is possible to attain various kinds of shading layers with different etch rates by changing the mixed ratio of the argon and the methane.

Figure 3:
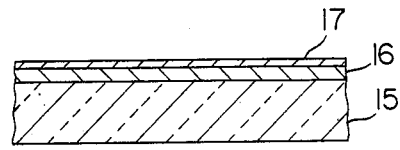
FIG. 3 shows a similar view of a photo-mask blank according to a preferred embodiment of this invention.

Referring to FIG. 3, a low reflection blank according to a preferred embodiment of this invention comprises similar parts designated by like reference numerals. The shading layer 16 is applied to the substrate 15 in a manner similar to that illustrated with reference to FIG. 2 and, consequently, includes the coexistence of chromium and chromium carbide. Specifically, the shading layer 16 was deposited onto the substrate 15 to a thickness of 570 angstroms by the sputtering device described with reference to FIG. 2. Reactive sputter was carried out in the mixed gas of the argon and the methane which included, by volume, 90% of the argon and 10% of the methane.

The low reflection blank further comprises an antireflection layer 17 including chromium oxide and chromium nitride to provide coexistence of the chromium oxide and chromium nitride. Thus, the chromium oxide in the antireflection layer is subjected to modification by the chromium nitride. The chromium nitride may be unequally dispersed in the chromium oxide.

The antireflection layer 17 was deposited onto the shading layer 16 to a thickness of about 250 angstroms by the sputtering device in a mixed gas including, by volume, 80% of argon and 20% of nitrogen monoxide. The total pressure of the mixed gas was about $1.3 \times 10^{-3}$ Torr. Deposition of the antireflection layer 17 continuously followed deposition of the shading layer 16 in the same hollow space. No contamination takes place on the shading layer 16 and the antireflection layer 17 because the substrate 15 is not moved in the atmosphere and no dust which would accompany movement of the substrate 15 becomes attached to the substrate 15. It took about 43 seconds to etch both the shading and the antireflection layers 16 and 17 deposited in the above-mentioned manner, by the etchant described with reference to FIG. 1. The side etch rate was equal to 0.06 micron per ten seconds.

From this fact, it is readily understood that the side etch rate is reduced in the low reflection blank according to this invention in comparison with the conventional blank described with reference to FIG. 1. Inasmuch as the etch rate of the antireflection layer is approximately equal to that of the shading layer, occurrence of undercuts can favorably be reduced at the shading layer underlying the edge of the antireflection layer. Further, the etch rate of the shading layer 16 is adjustable to that of the antireflection layer 17 by changing the ratio of argon and methane. This means that the shading layer may be deposited with reference to the etch rate of the antireflection layer to be formed on the shading layer.

Figure 4:
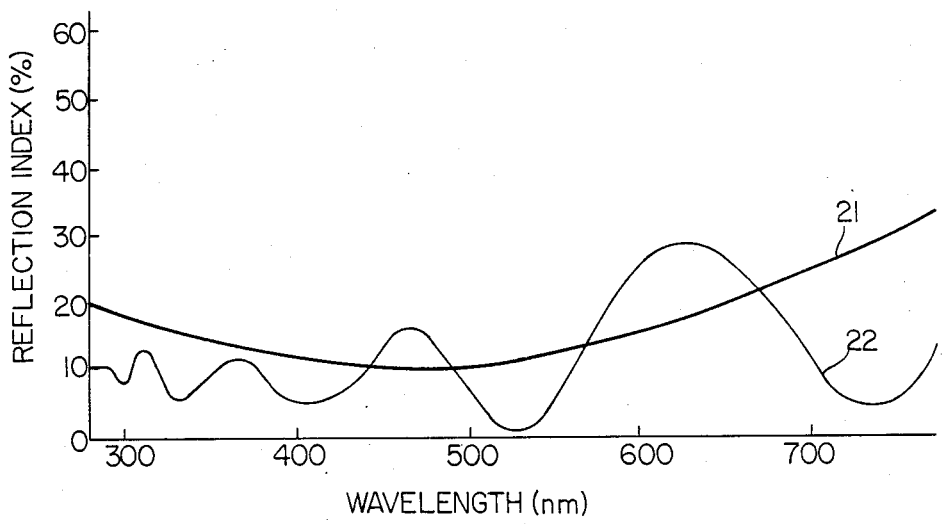
FIG. 4 shows a graphical representation of characteristics of the photo-mask blank illustrated in FIG. 3.

Referring to FIG. 4, the low reflection blank illustrated in conjunction with FIG. 3 has a reflection index versus wavelength characteristic as shown by curve 21, without a photoresist layer on the blank. As regards the wavelength region between 400 and 500 nanometers, a maximal value of the curve 21 reaches about 11% while that of the curve 11 illustrated in FIG. 1, about 10%. Therefore, the low reflection blank according to this invention is somewhat higher in reflection index than the conventional mask blank in the wavelength region between 400 and 500. It will, however, be seen that the low reflection blank according to this invention exhibits a reflection index less than 20% in the broad wavelength region between 350 and 600 nanometers and is flat in the characteristic as compared with the conventional blank described with reference to FIG. 1. Thus, the antireflection layer 17 serves to reduce reflection of light in at least a part of the predetermined wavelength region.

In FIG. 4, curve 22 shows the reflection index versus wavelength characteristic when the low reflection blank according to this invention is covered with the photoresist layer of AZ-1350 described before. As shown by the curve 22, the reflection index never exceeds 30% even in the wavelength region exceeding 600 nanometers. The low reflection blank illustrated in FIG. 3 exhibits a low and uniform reflection index over a wide wavelength region. This means that the mask blank is also useful in the wavelength region above 600 nanometers.

According to this invention, it is possible to improve the reflection index versus wavelength characteristics in addition to the etch rate of the shading layer. Thus, fine patterns can be precisely delineated with the shading and the antireflection layers selectively remaining on the substrate 15. It is, therefore, possible to fabricate, by selectively etching the shading and the antireflection layers, a mask having precise and fine patterns without substantial undercuts of the shading layer 16. In other words, the mask according to this invention comprises the antireflection layer remaining and superposed only on the selectively remaining shading layer.

While this invention has thus far been described in conjunction with a few embodiments thereof, it is readily possible for those skilled in the art to practice this invention in various ways. For example, various kinds of gases may be used to deposit the shading layer, instead of the mixed gas of argon and methane. The substrate may be of quartz and/or may comprise a transparent flat plate covered with a conductive and transparent film of a material, such as indium oxide, stannic oxide or the like, which defines the principal surface.

What is claimed is:

1. A method of manufacturing a photo-mask blank which comprises a substrate transparent to light in a predetermined wavelength region and having a principal surface, a shading layer on said principal surface for shading the light in said predetermined wavelength region, and an antireflection layer on said shading layer for reducing reflection of light in at least a part of said predetermined wavelength region, said shading and said antireflection layers being deposited onto said substrate in a hollow space by sputtering, said method comprising the steps of:

positioning a target of chromium and said substrate in said hollow space;

filling said hollow space with a first gas including methane and an inert gas;

sputtering particles of said target onto said principal surface to deposit, as said shading layer, a layer including chromium and chromium carbide resulting from the reaction of said particles with carbon from said methane in said hollow space;

filling said hollow space with a second gas including oxygen after deposition of said shading layer; and sputtering the particles of said target onto said shading layer to deposit, as said antireflection layer, a layer including chromium oxide resulting from the reaction of said particles with said oxygen in said hollow space.

2. A method as claimed in claim 1, said first gas filling step comprising the steps of:

providing argon as said inert gas, and mixing said argon with said methane at a predetermined ratio to fill said hollow space with a mixed gas of said argon and said methane as said first gas;

said second gas filling step comprising the steps of:

providing argon and nitrogen monoxide; and mixing said argon with said nitrogen monoxide to fill said hollow space with another mixed gas of said argon and said nitrogen monoxide as said second gas.

3. A method as claimed in claim 1, wherein said second gas comprises a mixture of nitrogen and oxygen.

4. A method as claimed in claim 3, wherein said mixture is nitrogen monoxide.

5. A method as claimed in claim 1, further comprising the step of adjusting the ratio of inert gas and carbon included in said methane in said first gas so that said shading layer has an etch rate substantially equal to that of said antireflection layer.

6. A method as claimed in claim 5, wherein the inert gas in said first gas is argon and the step of adjusting the ratio of inert gas and carbon included in said methane is carried out by controlling the ratio of argon and methane.

7. A method as claimed in claim 5, wherein said shading layer comprises chromium and chromium carbide which coexist in the form of interstitial chromium carbide.

* * * * *

UNITED STATES PATENT AND TRADEMARK OFFICE
CERTIFICATE OF CORRECTION

PATENT NO. : 4,657,648

DATED : Apr. 14, 1987

INVENTOR(S) : Nagarekawa

It is certified that error appears in the above—identified patent and that said Letters Patent is hereby corrected as shown below:

```
On the title page, add:

--Assignee:  Hoya Corporation
             Tokyo, Japan--
```

Signed and Sealed this

Nineteenth Day of July, 1988

Attest:

DONALD J. QUIGG

*Attesting Officer*    *Commissioner of Patents and Trademarks*